United States Patent [19]

Komatsu et al.

[11] Patent Number: 4,888,306
[45] Date of Patent: Dec. 19, 1989

[54] METHOD OF MANUFACTURING A BIPOLAR TRANSISTOR

[75] Inventors: Shigeru Komatsu, Yokohama; Hiroshi Inoue, Tokyo, both of Japan

[73] Assignee: Tokyo Shibaura Denki Kabushiki Kaisha, Kawasaki, Japan

[21] Appl. No.: 188,625

[22] Filed: Apr. 29, 1988

Related U.S. Application Data

[60] Continuation of Ser. No. 750,224, Jun. 28, 1985, abandoned, which is a continuation of Ser. No. 690,831, Jan. 14, 1985, abandoned, which is a division of Ser. No. 361,083, Mar. 23, 1982, abandoned, which is a continuation of Ser. No. 76,857, Sep. 19, 1979, abandoned.

[30] Foreign Application Priority Data

Sep. 26, 1978 [JP]  Japan ................................. 117433

[51] Int. Cl.⁴ ........................................... H01L 21/265
[52] U.S. Cl. ........................................ 437/162; 437/31; 437/233; 437/186; 148/DIG. 124; 148/DIG. 11; 357/59

[58] Field of Search ..................... 437/31, 32, 33, 162, 437/157, 160, 233, 238, 228, 186; 357/34, 59 H; 156/653, 657; 148/DIG. 10, DIG. 11, DIG. 124

[56] References Cited

U.S. PATENT DOCUMENTS

3,915,767 10/1975 Welliver .................................. 357/31
4,089,103  5/1978 Hendrickson ........................ 437/162
4,197,632  4/1980 Aomura .
4,210,996  7/1980 Amemiya .
4,224,088  9/1980 Komatsu et al. ..................... 437/162
4,279,671  7/1981 Komatsu .................... 148/DIG. 124
4,416,049  5/1970 McElroy .

Primary Examiner—Brian E. Hearn
Assistant Examiner—Kevin McAndrew
Attorney, Agent, or Firm—Finnegan, Henderson, Farabow, Garrett and Dunner

[57] ABSTRACT

A semiconductor device comprising a semiconductor substrate with at least one semiconductor region formed in it, a polycrystalline silicon layer formed in contact with the semiconductor region and a metal layer formed on the polycrystalline silicon layer. The peripheral portion and outer edges of the polycrystalline silicon layer are covered with an insulation layer.

8 Claims, 5 Drawing Sheets

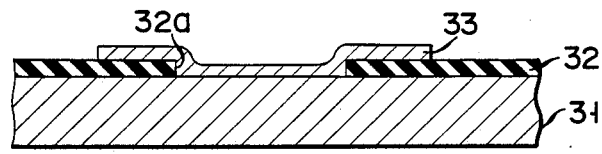
F I G. 4A
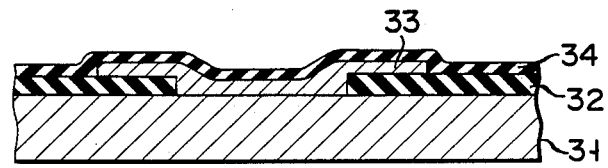
F I G. 4B
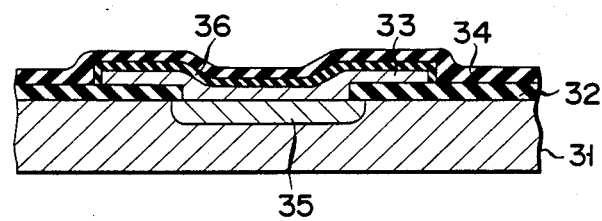
F I G. 4C
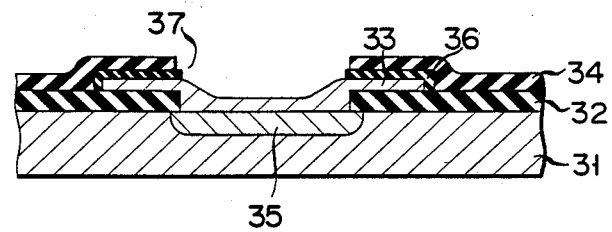
F I G. 4D
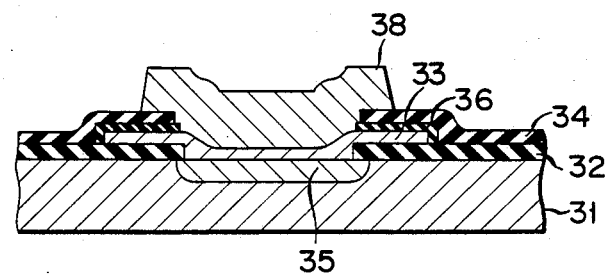
F I G. 4E

METHOD OF MANUFACTURING A BIPOLAR TRANSISTOR

This is a continuation of application Ser. No. 750,224 filed June 28, 1985, now abandoned, which is a continuation of application Ser. No. 690,831 filed Jan. 14, 1985, now abandoned, which is a division of application Ser. No. 361,083 filed Mar. 23, 1982, now abandoned, which is a continuation of application Ser. No. 076,857 filed Sept. 19, 1979, now abandoned.

This invention relates to a semiconductor device, and more particularly to a semiconductor device with an improved laminate structure formed in at least a portion of it.

Polycrystalline silicon is used very often to form a portion of an electrode in a semiconductor region such as base and emitter of a transistor or to form a portion of a resistor or a wiring layer in order to enhance the integration of a semiconductor device or to improve the performance of a transistor. It is used also as a source of impurity diffusion. Particularly it is effectively used as a source of impurity diffusion and as an electrode to form a emitter region of a high frequency transistor, improving the electric chaaracteristics and thus reliability of the transistor.

Generally a wiring layer is constituted by a metal layer. Thus a polycrystalline layer must be connected to the metal layer. That portion of the metal layer which is connected to the polycrystalline layer often happens to be cut, thus reducing the reliability of the semiconductor device. This occurs in the following process.

First, a polycrystalline silicon layer is deposited and cut in a desired pattern. A wiring metal layer is then, for example, vapor-deposited on the polycrystalline silicon layer and is photo-etched to provide wiring. More precisely, as shown in FIGS. 1A and 1B, the polycrystalline silicon layer 4 is laid partially in contact with a semiconductor region 2 formed in a semiconductor substrate 1 and fills an opening of an insulation layer 3 formed on the substrate 1.

The metal layer 5 has a boundary stepped portion 5a a between the portion laid on the layer 5 and the portion laid on the insulation layer 3. Usually, the boundary portion 5a is abnormally thin, and strain concentrates on it. The metal layer 5 is etched so that its greater part is on, not off, he polycrystalline silicon layer 5 as clearly shown in FIG. 1A. If the metal layer 5 is etched in this way, the integration of the semiconductor device will be enhanced, but side edges of the boundary portion 5a must directly contact the etching solution.

Once in a direct contact with the etching solution, the boundary portion 5a is etched too much due to electrode reaction, thus forming a V-groove or a cut in the metal layer 5. This excessive etching is acute in reverse proportion to the etching activation energy of the metal layer 5. Such a V-groove, if formed, makes it impossible to provide a proper elecrode leading or a desired wiring. The excessive etching may be lessened but never be avoided by depositing the metal layer 5 under specific conditions.

It is an object of this invention to provide a semiconductor device with an improved laminate structure which includes a metal layer and a polycrystalline silicon layer, which does not have the above-mentioned drawback of the prior art and which helps enhance the integration of the device.

According to this invention, a semiconductor device is provided which comprises a semiconductor substrate with at least one semiconductor region formed in it; a first insulation layer formed on said semiconductor substrate and having an opening exposing at least a portion of said semiconductor region; a polycrystalline silicon layer formed on said first insulation layer, filling the opening of said first insulation layer and covering said first insulation layer around the opening thereof; a second insulation layer so formed as to cover at least said polycrystalline silicon layer and having an opening at a position corresponding to the opening of said first insulation layer; and a metal layer so formed as to be connected to said polycrystalline silicon layer through the opening of said second insulation layer.

In one embodiment of the invention, said polycrystalline silicon layer constitutes an electron leading element.

In another embodiment of the invention, said polycrystalline silicon layer constitutes a portion of a resistor or a portion of a wiring element.

If said second insulation layer is to be formed relatively thick, it is formed in, so to speak, doublelayer structure including a first layer covering said polycrystalline silicon layer and a second layer covering not only the first layer but said first insulation layer. dr
This invention can be more fully understood from the following detailed description when taken in conjunction with the accompanying drawings, in which.

FIGS. 3A to 3DD illustrate how a semiconductor device according to this invention is manufacctured;

FIGS. 4A to 4E show how another semiconductor device according to this invention is manufactured; and FIGS. 5A to 5F show how still another semiconductor device of this invention is manufactured.

Figure 1A:
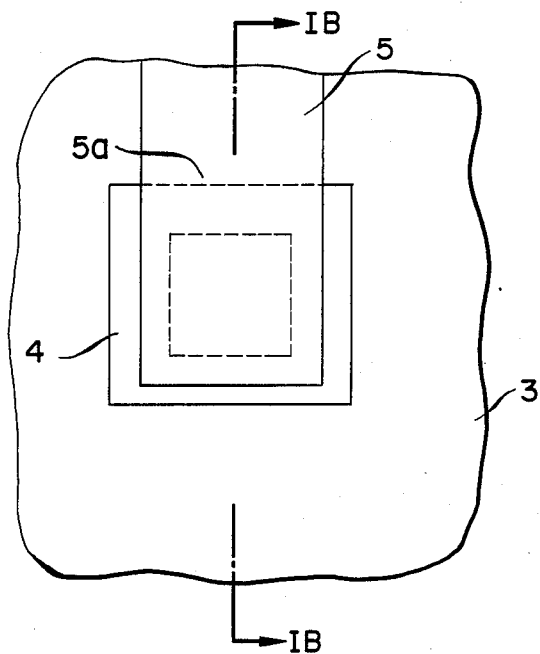
FIG. 1A is a plan view of a part of a conventional semiconductor device.
Figure 1B:
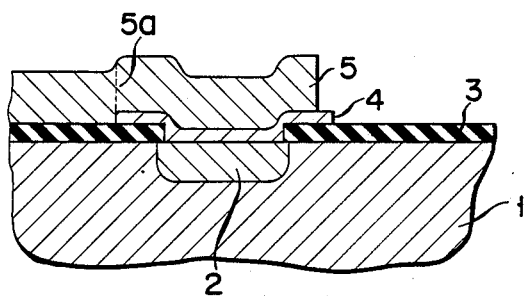
FIG. 1B is a cross sectional view of the device of FIG. 1, taken along line IB—IB in FIG. 1A.
Figure 2A:
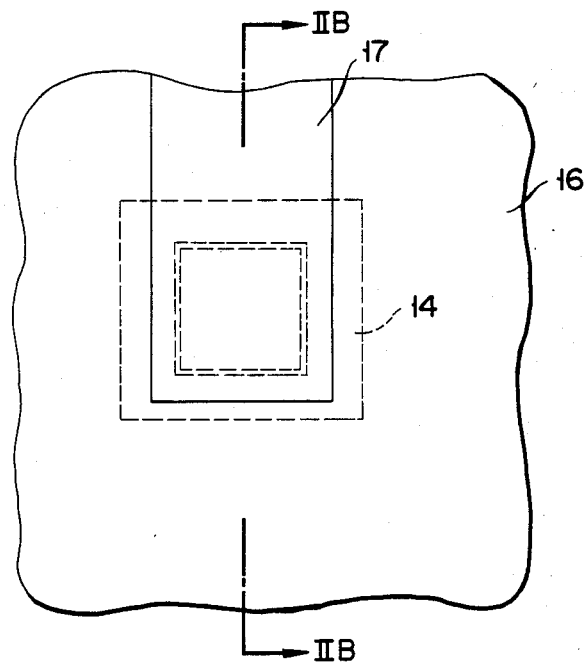
FIG. 2A is a plaln view of a part of a semiconductor device according to this invention.
Figure 2B:
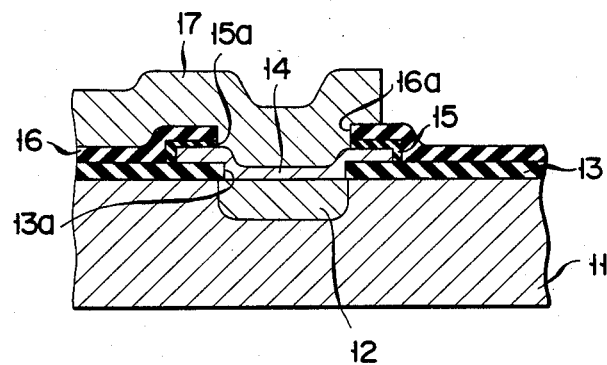
FIG. 2B is a cross-sectional view of the device of FIG. 2A, taken along line IIB—IIB in FIG. 2A.

FIGS. 2A and 2B show a semiconductor device according to this invention. In a semiconductor substrate 11 at least one semiconductor region 12, a bse or emitter region, is formed, the upper surface of which is on the same plane as that of the substrate 11. On the substrate 11 an insulation layer 13 of, for example, $SiO_2$ is formed. The insulation layer 13 has an opening 13a through which the semiconductor region 12 is exposed. A polycrystalline silicon lyer 14 fills the opening 13a and covers a portion of the insulation layer 13 around the opening 13a.

As FIG. 2B clearly shows, another insulation layer 15 of, for example, $SiO_2$ is formed so as to cover the peripheral portion of the polycrystalline silicon layer 14, both the upper surface and the outer edges. The insulation layer 15 has an opening 15aat a position corresponding to the opening 13a of the insulation layer 13.

If a thick insulation layer needs to be formed on the polycrystalline silicon layer 14, still another insulation layer 16 is formed partly on the insulation layer 15 and partly on the insulation layer 13 as illustrated in FIG. 2B. The insulation layer 16 has also an opening 16a at a position corresponding to the opening 13a of the insulation layer 13.

As shown in FIG. 2B, a metal wiring elemen 17 is formed on the insulation layer 16 and fills the openings 15a and 16a. It is therefore connected to the polycrystalline silicone layer 14.

Since the outer edges of the polycrystalline silicon layer 14 are covered with the insulation layer 15, they are not in direct contact with a metal layer. Thus, no electrode reaction takes place, and the metal layer is never be etched abnormally at the portion above the periphery of the polycrystalline silicon layer 14. That is, unlike in the conventional device, no V-groove is formed in the metal layer while the metal layer is being etched to provide a wiring layer in a specific pattern.

If necessary, n-type impurities such as arsenic and phosphorus or p-type impurities such as boron may be added to the polycrystalline silicon layer 14, thereby to improve the conductivity of the layer 14 or to provide a source of impurity diffusion. Further, a substance may be added to the insulation layer 15 or 16. For example, n-type impurity such as arsenic, or phosphorus (having a passivation effect) can be doped in the insulation layer formed of, for example, $SiO_2$ by reacting silane ($SiH_4$) with arsine ($AsH_3$) of phosphine ($PH_3$) at about 500° C. in a mixed gas atmosphere of $O_2$ and $N_2$. Likewise, p-type impurity such as boron can be doped in the insulation layer by the reacion of silane with boron hydride ($B_2H_6$) under the same conditions.

Now referring to FIGS. 3A to 3D, it will be described how a semiconductor device according to this invention is manufactured.

Figure 3A:
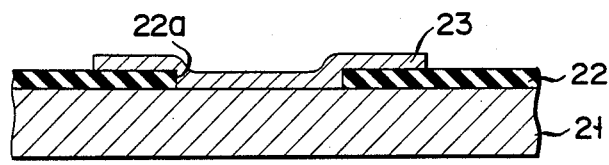

First, as shown in FIG. 3A, on a silicon substraate 21 an insulation layer 22 of, for instance, silicon oxide ($SiO_2$) is formed, for example, about 3,000 Å thick. Photo-etching is conducted on the $SiO_2$ layer 22 in the known method, thus forming an opening 22a, through which that portion of the substrate 21 where an emitter region will be formed is exposed. Then, an arsenic-doped polycrystalline silicon layer 23 is formed about 2,000 Å thick on the $SiO_2$ layer 22, thus filling the opening 22a. This may be accomplished by decomposing silane ($sIH_4$) and arsine ($AsH_3$) at, for example, 650° C. under an inert atmosphere in a high frequency furnace. Thereafter, the polycrystalline silicon layer 23 is plasma-etched to have a desired pattern. The layer 23 thus plasma-etched fills the opening 22a and covers the portion of the $SiO_2$ layer around the opening 22a.

Figure 3B:
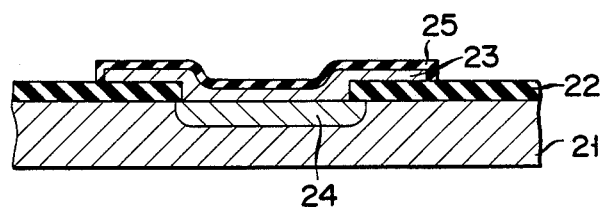

The semiconductor structure of FIG. 3A is then heated at 1,000° C. in an oxidation atmosphere. The arsenic in the polycrystalline silicon layer 23 is diffused into the substrate 21, thereby formin an emitter region 24 as shown in FIG. 3B. During this heating process, a silicon oxide ($SiO_2$) layer 25 is formed to cover the polycrystalline silicon layer 23, both the upper surface and the outer edges as illustrated in FIG. 3B. The oxidation conditions are so regulated as to form the $SiO_2$ layer 25, for example, about 1,000 Å thick.

Figure 3C:
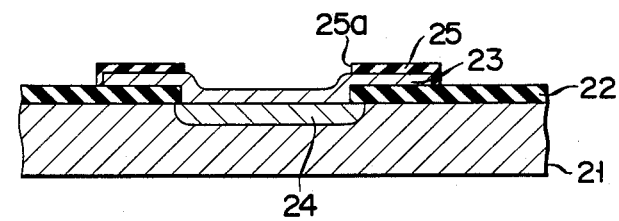

Then, the $SiO_2$ layer 25 is photo-etched in the known manner to have an opening 25a at a position corresponding to the opening 22a of the $SiO_2$ layer 22 as illustrated in FIG. 3C. Ammonium fluoride solution is used as the etching solution, and the photo-etching is conducted for about 1 minute.

Figure 3D:
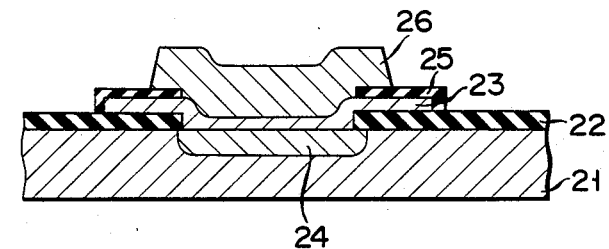

Finally, a metal layer of, for instance, Al-Si(2%)-Cu(2%) alloy is deposited by sputtering about 1 micron thick. The metal layer is etched for about 7 minutes, using an aqueous solution of phosphoric acid, acetic acid and nitric acid, thereby providing an electrode 26 which lies, as shown in FIG. 2A, on a part of the upper surface of the layer 23 and fills the opening 25a and thus contacts the central portion of the polycrystalline silicon layer 23 as shown in FIG. 3D.

The metal layer is never etched abnormally due to electrode reaction since it is not in direct contact with the outer edges of the polycrystalline silicon layer 23 which are covered with the insulation layer 25. If plasma etching is carried out to remove residual silicon remaining after the etching of the Al-Si-Cu layer, that portion of the layer 23 which is not covered by the metal layer 26 is never etched. This is because the polycrystalline silicon layer 23 is not exposed.

Now referring to FIGS. 4A to 4E, it will be described how to manufacture another semiconductor device according to this invention. This embodiment is desirable in case an insulation layer should be formed so thick on a polycrystalline silicon layer that the polycrystalline silicon layer may be used as, for example, a resistor or a wiring element.

First, as shown in FIG. 4A, on a silicon substrate 31, an oxide layer 32 having an opening 32a is formed and an arsenic-doped polycrystalline silicon layer 33 is formed, in the same manner as described above with reference to FIG. 3A.

Then, as shown in FIG. 4B, on the entire surface of the semiconductor structure of FIG. 4A there is formed an insulation layer 32. The insulation layer 32 is made of such material, for example $SiO_2$, as can be selectively etched with respect to polycrystalline silicon. Generally two materials are regarded as "selectively etched" if one of them is etched by a specific etchant at a rate at least three to ten times as high as the other is etched by the same etchant. Further, $SiO_2$ can be etched 100 to 1,000 times as rapidly as polycrystalline silicon by plasma etching, thus performing selective etching. The $SiO_2$ layer 34 may be formed about 2,000 Å by vapor phase growth at 500° C.

The semiconductor structure of FIG. 4B is then heated at 950° C. to 1,000° C. in an oxidation atmosphere. The arsenic in the polycrystalline silicon layer 33 is diffused into the substrate 31, thereby forming an emitter region 35. During this heating process, a silicon oxide ($SiO_2$) layer 36 is formed about 500–1,000 Å thick on the entire surfce of the polycrystalline silicon layer 33 as illustrated in FIG. 4C. The $SiO_2$ layer 36 compensates for the defect of the $SiO_2$ layer 34.

Thereafter, openings 37 are formed in the $SiO_2$ layers 34 and 36 in the same manner as described above with reference to FIG. 3C. In this way, the polycrystalline silion layer 33 is partially exposed as shown in FIG. 4D.

Finally, a metal layer is formed by vapor deposition or sputtering and is etched to have a desired pattern, thus providing a wiring element 38, as shown in FIG. 4E.

Now referring to FIGS. 5A to 5F, it will be described how to manufacture a further semiconductor device according to this invention. This embodiment is desirable also in case a polycrystalline silicon layer should be used as a resistor or a wiring element.

Figure 5A:
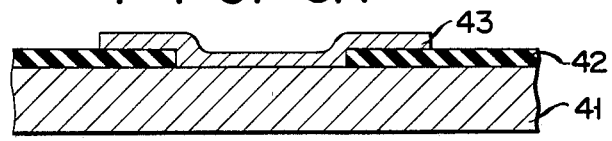

First, as shown in FIG. 5A, on a silicon substrate 41, an insulation layer 42 of, for example, $SiO_2$ with an opening is formed and an arsenic-doped polycrystalline silicon layer 43 is formed, both in the same manner as described above with reference to FIG. 3A.

Figure 5B:
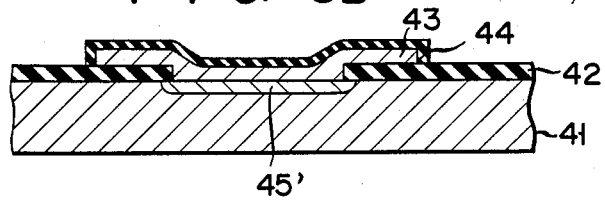

Steam oxidation is then conducted on the semiconductor structure of FIG. 5A, thus oxidizing he polycrystalline silicon layer 43 and forming an $SiO_2$ layer 44 on the entire exposed surface of the layer 43 as illustrated in FIG. 5B. During the steam oxidation, the arsenic in the layer 42 is diffused into the substrate 41, thus forming an emitter region 45', though incompletely.

Figure 5C:
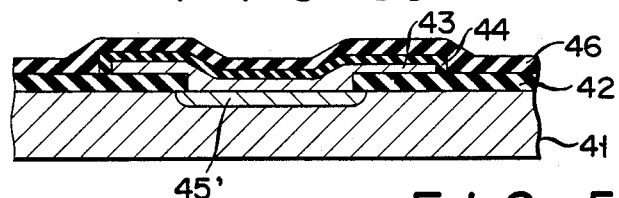

Then, an SiO₂ layer 46 is formed, as shown in FIG. 5C, on the entire surface of the semiconductor structure of FIG. 5B in the same manner as described above with reference to FIG. 4B.

Figure 5D:
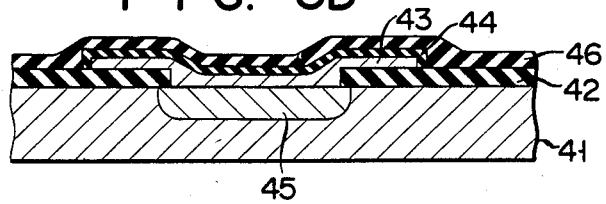

Thereafter, the semiconductor structure of FIG. 5C is heated at 950° C. to 1,000° C. in an oxidation atmosphere, thus forming a complete emitter region 45 as illustrated in FIG. 5D.

Figure 5E:
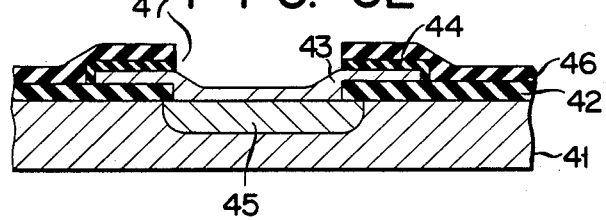

Both SiO₂ layers 44 and 46 are then etched in the same manner as described above with reference to FIG. 3C, thereby forming openings 47. Through these openings 47 the polycrystalline silicon layer 43 is partially exposed as shown in FIG. 5E.

Figure 5F:
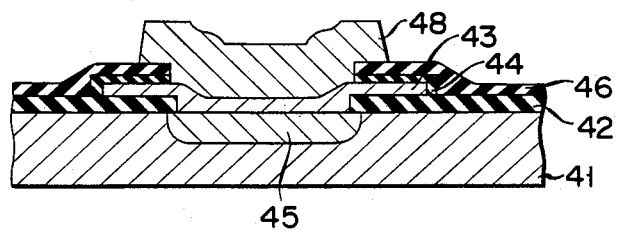

Finally, a metal layer is deposited and etched to have a desired pattern, thus providing a wiring element 48 as shown in FIG. 5F.

In the above-described embodiments, the polycrystalline silicon layer is doped with arsenic. Instead, it may be doped with phosphorus or boron, whereby a pnp transistor will be manufactured. The metal layer maybe formed of aluminum, titanium, tungsten, molybdenum or the like.

What we claim is:

1. A method for manufacturing a bipolar transistor device comprising the steps of:

forming a first insulation layer on a semiconductor substrate;

forming a first opening in said first insulation layer to expose at least a portion of said semiconductor substrate corresponding to an emitter region;

forming a layer of polycrystalline silicon containing an impurity on said first insulation layer to fill said first opening in said first insulation layer and to cover portions of said first insulation layer surrounding said first opening, said layer of polycrystalline silicon having edges lying on said first insulaion layer and also having a peripheral portion lying on said first insulation layer and including said edges;

heating said polycrystalline silicon layer under an oxidizing atmosphere to diffuse said impurity into said substrate to form said emitter region and to simultaneously form a second insulation layer by thermal oxidation of said polycrystalline silicon layer, said second insulation layer covering said edges and said peripheral portion of said polycrystalline silicon layer;

etching said second insulation layer at locations other than at said peripheral portion and said edges of said polycrystalline silicon layer;

depositing a metal layer on said first insulation layer and on said polycrystalline silicon layer at locations other than said peripheral portion of said polycrystalline silicon layer, said second insulation layer preventing the deposition of said metal layer on said peripheral portion and said edges of said polycrystalline silicon layer; and selectively etching said metal layer for form a wiring layer extending onto said first insulation layer.

2. A method according to claim 1 wherein sid step of heating said polycrystalline layer includes the steps of forming said second insulation layer of a material which can be selectively etched with respect to polycrystalline silicone, and forming said material to cover said first insulation layer.

3. The method according to claim 1 wherein said step of heating said polycrystalline silicon layer includes the step of forming said second insulation layer of silicon oxide.

4. The method according to claim 3 wherein said step of forming said second insulation layer also includes the step of forming said second insulation layer with a substance which has a passivation effects.

5. The method according to claim 1 wherein said step of forming said polycrystalline silicon layer includes the step of forming said polycrystalline layer as a resistor.

6. The method according to claim 1 wherein said step of forming said polycrystalline silicon layer includes the step of forming said polycrystalline layer as a wiring element.

7. The method according to claim 1 wherein said step of forming a polycrystalline layer includes the step of using an n-type or p-type impurity.

8. The method according to claim 1 wherein said step of depositing said metal layer includes the step of separating said metal layer from the edges of said polycrystalline silicon layer by said second insulation layer.

* * * * *